US008963100B2

(12) United States Patent
Yasaka et al.

(10) Patent No.: US 8,963,100 B2
(45) Date of Patent: Feb. 24, 2015

(54) NITROGEN IONS FROM A GAS FIELD ION SOURCE HELD AT A PRESSURE OF 1.0 X 10(-6) PA TO 1.0 X 10(-2) PA

(71) Applicants: Anto Yasaka, Chiba (JP); Fumio Aramaki, Chiba (JP); Yasuhiko Sugiyama, Chiba (JP); Tomokazu Kozakai, Chiba (JP); Osamu Matsuda, Chiba (JP)

(72) Inventors: Anto Yasaka, Chiba (JP); Fumio Aramaki, Chiba (JP); Yasuhiko Sugiyama, Chiba (JP); Tomokazu Kozakai, Chiba (JP); Osamu Matsuda, Chiba (JP)

(73) Assignee: Hitachi High-Tech Science Corporation (JP)

( * ) Notice: Subject to any disclaimer, the term of this patent is extended or adjusted under 35 U.S.C. 154(b) by 0 days.

(21) Appl. No.: 13/654,509

(22) Filed: Oct. 18, 2012

(65) Prior Publication Data
US 2013/0099133 A1    Apr. 25, 2013

(30) Foreign Application Priority Data
Oct. 20, 2011    (JP) .................. 2011-230769

(51) Int. Cl.
H01J 37/08    (2006.01)
G21K 5/04    (2006.01)
H01J 37/305    (2006.01)
(52) U.S. Cl.
CPC . *G21K 5/04* (2013.01); *H01J 37/08* (2013.01); *H01J 37/3056* (2013.01); *H01J 2237/0807* (2013.01)
USPC ...................................... 250/423 F

(58) Field of Classification Search
USPC ........ 250/423 F; 315/111.01, 111.31, 111.81, 315/111.11, 111.91
See application file for complete search history.

(56) References Cited

U.S. PATENT DOCUMENTS

| | | | |
|---|---|---|---|
| 4,503,329 A | 3/1985 | Yamaguchi et al. | 250/309 |
| 6,042,738 A | 3/2000 | Casey, Jr. et al. | 216/66 |
| 6,440,615 B1 | 8/2002 | Shimizu | 430/5 |
| 7,511,280 B2 * | 3/2009 | Ward et al. | 250/423 F |
| 2002/0130039 A1 * | 9/2002 | Hojoh et al. | 204/275.1 |
| 2009/0179161 A1 * | 7/2009 | Ward et al. | 250/492.21 |
| 2009/0200485 A1 * | 8/2009 | Kolodney et al. | 250/423 F |
| 2009/0230299 A1 * | 9/2009 | Shichi et al. | 250/423 R |
| 2010/0108902 A1 * | 5/2010 | Frosien et al. | 250/396 R |

(Continued)

FOREIGN PATENT DOCUMENTS

| | | | |
|---|---|---|---|
| JP | 03122643 | 5/1991 | |
| JP | 08133755 A * | 5/1996 | C03B 11/00 |

(Continued)

OTHER PUBLICATIONS

Lieszkowvszky et al. "Metrological Characteristics of a Group of Quadrupole Partial Pressure Analyzers" J. Ca. Sol. Tech. A (5), Sep./Oct. 1990, pp. 3838-3854.*

*Primary Examiner* — Brooke Purinton
(74) *Attorney, Agent, or Firm* — Adams & Wilks

(57) ABSTRACT

A focused ion beam apparatus has an ion source chamber in which is disposed an emitter for emitting ions. A gas supply unit supplies nitrogen gas to the ion source chamber so that the nitrogen gas adsorbs on the surface of the emitter, and the gas supply unit maintains the pressure in the ion source chamber in the range $1.0 \times 10^{-6}$ Pa to $1.0 \times 10^{-2}$ Pa. An extracting electrode is spaced from the emitter, and a voltage is applied to the extracting electrode to ionize the adsorbed nitrogen gas and extract nitrogen ions in the form of an ion beam. A temperature control unit controls the temperature of the emitter.

18 Claims, 4 Drawing Sheets

(56) References Cited

U.S. PATENT DOCUMENTS

| | | |
|---|---|---|
| 2010/0178601 A1* | 7/2010 | Takaoka .............................. 430/5 |
| 2011/0049364 A1* | 3/2011 | Knippelmeyer et al. ...... 250/307 |
| 2011/0226948 A1* | 9/2011 | Tanaka et al. ................. 250/307 |
| 2012/0328974 A1* | 12/2012 | Takaoka ........................ 250/306 |

FOREIGN PATENT DOCUMENTS

| | | |
|---|---|---|
| JP | 2000347384 | 12/2000 |
| JP | 2003228162 | 8/2003 |
| JP | 2005189492 | 7/2005 |

\* cited by examiner

NITROGEN IONS FROM A GAS FIELD ION SOURCE HELD AT A PRESSURE OF 1.0 X 10(-6) PA TO 1.0 X 10(-2) PA

BACKGROUND OF THE INVENTION

1. Field of the Invention

The present invention relates to a focused ion beam apparatus including a gas field ion source.

2. Description of the Related Art

As an ion source of a focused ion beam apparatus, a gas field ion source which ionizes a material gas and emits an ion beam is known.

As an apparatus which uses a gas field ion source, for example, a focused ion beam apparatus has been proposed which irradiates an argon ion beam from the gas field ion source and performs micromachining such as repairing a defect in a photomask (see International Patent WO2009/022603A1).

However, the apparatus disclosed in International Patent WO2009/022603 has a problem in that, when a sample is observed, the sample is damaged due to the sputtering effect of an argon ion beam. On the other hand, a helium ion beam has a problem in that the etching efficiency is low when a sample is processed, and thus, it takes an enormous amount of time to carry out the processing.

SUMMARY OF THE INVENTION

The present invention has been made in view of the above-mentioned circumstances, and the present invention provides a focused ion beam apparatus including a gas field ion source which reduces damage to a sample much and which performs micromachining with efficiency.

(1) A focused ion beam apparatus according to an exemplary embodiment of the present invention includes a gas field ion source including: an emitter for emitting an ion beam; an ion source chamber for containing the emitter; a gas supply unit for supplying nitrogen to the ion source chamber; an extracting electrode to which a voltage for ionizing the nitrogen and for extracting nitrogen ions is applied; and a temperature control unit for cooling the emitter.

If a gas having a larger mass than that of nitrogen is supplied into the ion source chamber and is ionized, the mass of the ions is large, and thus, the ion beam causes much damage to a sample. On the other hand, if a gas having a smaller mass than that of nitrogen is supplied into the ion source chamber and is ionized, the mass of the ions is small, and thus, the sputtering efficiency of a sample by the ion beam is low, and it takes an enormous amount of time to carry out the processing. Accordingly, by using nitrogen as the material gas as described above, damage to the sample may be alleviated and the sample may be processed with efficiency.

(2) In the focused ion beam apparatus according to the exemplary embodiment of the present invention, the gas supply unit controls supply of nitrogen gas so that a pressure in the ion source chamber is $1.0 \times 10^{-6}$ Pa to $1.0 \times 10^{-2}$ Pa. Further, it is preferred that the gas supply unit control supply of the nitrogen gas so that the pressure in the ion source chamber is $1.0 \times 10^{-5}$ Pa to $1.0' 10^{-3}$ Pa.

If the pressure in the ion source chamber is higher than $1.0 \times 10^{-2}$ Pa, nitriding of the emitter is promoted, and by applying an extracting voltage, the emitter is broken due to field evaporation. On the other hand, if the pressure in the ion source chamber is lower than $1.0 \times 10^{-6}$ Pa, an ion beam with a sufficient amount of current cannot be obtained. Accordingly, by controlling supply of the nitrogen gas as described above, the emitter may be prevented from being broken due to field evaporation and an ion beam with a sufficient amount of current may be irradiated.

(3) In the focused ion beam apparatus according to the exemplary embodiment of the present invention, the temperature control unit controls a temperature of the emitter to be 40 K to 200 K.

If the temperature of the emitter is higher than 200 K, supply of the gas to an ionizing region decreases, and an ion beam with a sufficient amount of current cannot be obtained. On the other hand, if the temperature of the emitter is lower than 20 K, the gas is solidified in a low temperature portion in the ion source chamber or in proximity to the emitter, which interferes with stable operation. Accordingly, by controlling the temperature of the emitter as described above, an ion beam with a sufficient amount of current may be irradiated with stability.

(4) The focused ion beam apparatus according to the exemplary embodiment of the present invention applies a voltage of 0.5 kV to 20 kV to the extracting electrode.

If the extracting voltage is higher than 20 kV, the emitter is broken due to electric discharge or field evaporation of the emitter material. On the other hand, if the extracting voltage is lower than 0.5 kV, nitrogen is not ionized, and thus, an ion beam cannot be irradiated. Accordingly, by controlling the voltage applied to the extracting electrode as described above, an ion beam may be irradiated without breaking the emitter due to electric discharge or field evaporation of the emitter material.

(5) In the focused ion beam apparatus according to the exemplary embodiment of the present invention, the ion beam emitted from the gas field ion source is used to repair a defect in a mask. If a gas having a larger mass than that of nitrogen is supplied into the ion source chamber and is ionized, the mass of the ions is large, and thus, the ion beam damages a sample much. On the other hand, if a gas having a smaller mass than that of nitrogen is supplied into the ion source chamber and is ionized, the mass of the ions is small, and thus, the sputtering efficiency of a sample by the ion beam is low, and it takes an enormous amount of time to repair a defect. Accordingly, by using nitrogen as the material gas as described above, damage to the mask may be alleviated and a defect in the mask may be repaired with efficiency.

According to the present invention, the focused ion beam apparatus may perform micromachining using the gas field ion source without damaging a sample much and with efficiency.

DETAILED DESCRIPTION OF THE PREFERRED EMBODIMENTS

First Embodiment

A focused ion beam apparatus according to an embodiment of the present invention is described in the following.

This embodiment relates to a focused ion beam apparatus including a gas field ion source. The gas field ion source ionizes, by forming a high electric field around a tip of an emitter which is sharpened at an atomic level in an ion source chamber into which an ion source gas is supplied, the ion source gas adsorbed to the tip to emit an ion beam. The light source diameter of the ion beam emitted from the tip of the emitter is as small as several angstroms, and thus, an ion beam having a small diameter and high intensity may be irradiated onto a sample.

The focused ion beam apparatus according to this embodiment does not use an ion beam of low mass element such as helium, but uses an ion beam of nitrogen having high sputtering efficiency to process a sample. However, when nitrogen is used as the ion source gas, nitrogen reacts with tungsten which is mainly used as a material of the emitter to form tungsten nitride. Field evaporation of tungsten nitride occurs at a voltage which is lower than that in the case of tungsten. Therefore, there is a problem in that, when a voltage necessary for ionizing nitrogen is applied, field evaporation of the emitter occurs.

Therefore, according to the focused ion beam apparatus of this embodiment, by controlling a gas partial pressure in the ion source chamber or the like, nitrogen is ionized and an ion beam is emitted without field evaporation of the emitter. This enables processing with higher processing speed compared with a case of helium with less damage to the sample compared with a case of an argon ion beam.

Figure 1:
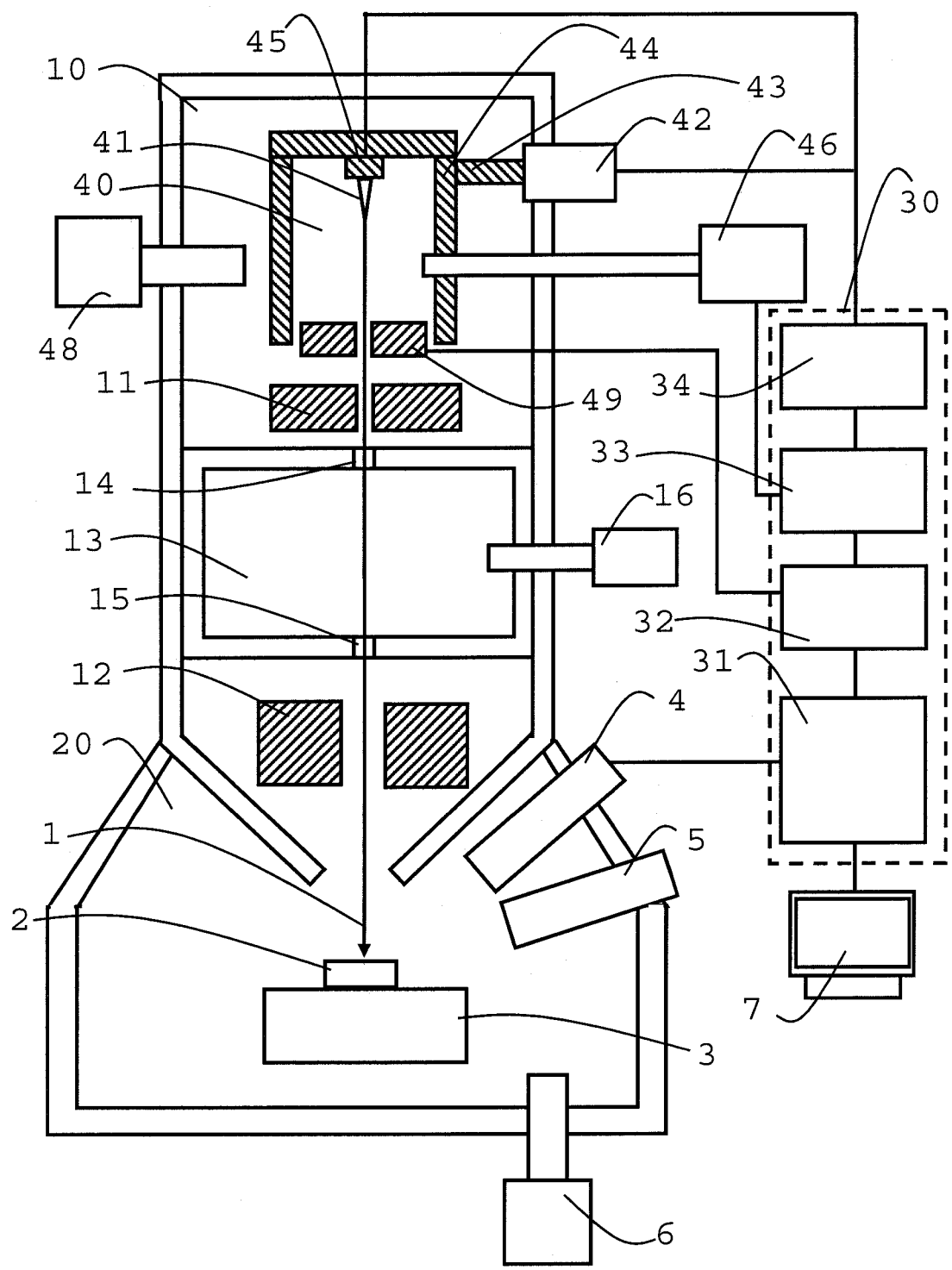
FIG. 1 is a configuration diagram of a focused ion beam apparatus according to an embodiment of the present invention.

With regard to the configuration of the apparatus, as illustrated in FIG. 1, the apparatus mainly includes an ion beam column 10, a sample chamber 20, and a control unit 30.

The sample chamber 20 contains a sample stage 3 for moving a sample 2 to an irradiation position onto which an ion beam 1 from the ion beam column 10 is irradiated.

The sample stage 3 operates according to a command of an operator, and may operate on five axes. Specifically, the sample stage 3 is supported by a position changing mechanism which includes an XYZ axis mechanism for moving the sample stage 3 along an X axis, a Y axis, and a Z axis, the X axis and the Y axis being orthogonal to each other within a plane and the Z axis being orthogonal to both the X axis and the Y axis, a tilt axis mechanism for rotating and tilting the sample stage 3 about the X axis or the Y axis, and a rotating mechanism for rotating the sample stage 3 about the Z axis.

The sample chamber 20 further includes a detector 4 for detecting secondary ions and secondary electrons generated by scanning and irradiation of the ion beam 1. From a detection signal of the secondary ions and secondary electrons and a scan signal of the ion beam 1, an observation image may be formed. When a reflected ion detector is used as the detector 4, reflected ions generated from the sample 2 may be detected to form an image by reflected ions.

The sample chamber 20 further includes a gas supply unit 5 which may spray gas on the sample 2 during irradiation of the ion beam 1. The gas supply unit 5 includes a gas storing unit for storing gas and a nozzle unit for spraying gas around the sample 2. The gas supply unit 5 may include a gas flow rate control unit for controlling the flow rate of the gas, such as a mass flow controller.

The sample chamber 20 includes a vacuum pump 6 for evacuating the sample chamber 20. This enables control of the vacuum in the sample chamber 20.

The control unit 30 includes an image formation unit 31 for forming an observation image from a detection signal from the detector 4. An observation image formed by the image formation unit 31 is displayed on a display unit 7. Therefore, by irradiating the ion beam 1 onto the sample 2 and detecting the generated secondary ions and secondary electrons, an observation image of the sample 2 may be displayed on the display unit 7 to be observed.

The ion beam column 10 includes a condenser lens electrode 11 for condensing the ion beam 1 emitted from an ion source chamber 40, and an objective lens electrode 12 for focusing the ion beam 1 on the sample 2. Further, the ion beam column 10 includes an intermediate chamber 13 between the ion source chamber 40 and the sample chamber 20. The intermediate chamber 13 includes an orifice 14 between the ion source chamber 40 and the intermediate chamber 13, and an orifice 15 between the sample chamber 20 and the intermediate chamber 13. The ion beam 1 passes through the orifices 14 and 15 to be irradiated onto the sample 2. The intermediate chamber 13 includes a vacuum pump 16. This enables control of the vacuum in the intermediate chamber, and the intermediate chamber 13 may conduct differential evacuation between the sample chamber 20 and the ion source chamber 40.

The ion source chamber 40 includes an emitter 41 for emitting the ion beam 1, a cooling apparatus 42 for cooling the emitter 41, an ion source gas supply unit 46 for supplying the ion source gas to the emitter 41, and a vacuum pump 48 for evacuating the ion source chamber 40. The emitter 41 is cooled by the cooling apparatus 42 via a connecting portion 43 for connecting the cooling apparatus 42 and the ion source chamber 40 and via a wall portion 44 of the ion source chamber 40. Further, the emitter 41 is connected to a heater 45. Therefore, the temperature of the emitter 41 may be controlled. The cooling apparatus 42 and the heater 45 are controlled by a temperature control unit 34 of the control unit 30.

In this case, the cooling apparatus 42 is an apparatus for cooling the emitter 41 by using a cooling medium such as liquid nitrogen or liquid helium contained therein. As the cooling apparatus 42, a closed cycle refrigerator of the GM type, of the pulse tube type, or the like, or a gas flow refrigerator may be used.

The emitter 41 is formed of tungsten or molybdenum. Alternatively, the emitter 41 is a needle-shaped base material, which is formed of tungsten or molybdenum and coated with a precious metal such as platinum, palladium, iridium, rhodium, or gold. The tip of the emitter 41 is in the shape of a pyramid sharpened at an atomic level.

The tip of the emitter 41 is in a sharp pointed shape. Nitrogen ions are emitted from this tip. The energy distribution width of the ion beam 1 is extremely narrow, and thus, the effect of the chromatic aberration may be inhibited, and, compared with a case of, for example, a plasma gas ion source or a liquid metal ion source, an ion beam having an extremely small beam diameter and high intensity may be obtained.

Further, the ion source chamber 40 includes an extracting electrode 49 for forming an electric field for extracting the ion beam 1 around the emitter 41. The voltage applied to the extracting electrode 49 is controlled by an extracting voltage control unit 32 of the control unit 30.

The ion source chamber 40 includes the ion source gas supply unit 46 for supplying the ion source gas. The ion source gas supply unit 46 includes the gas storing unit for storing the ion source gas and the nozzle unit for supplying the ion source gas around the emitter 41. The ion source gas supply unit 46 includes a gas flow rate control unit for controlling the flow rate of the ion source gas, such as a mass flow controller. The ion source gas supply unit 46 is controlled by an ion source gas control unit 33 of the control unit 30.

Figure 2:
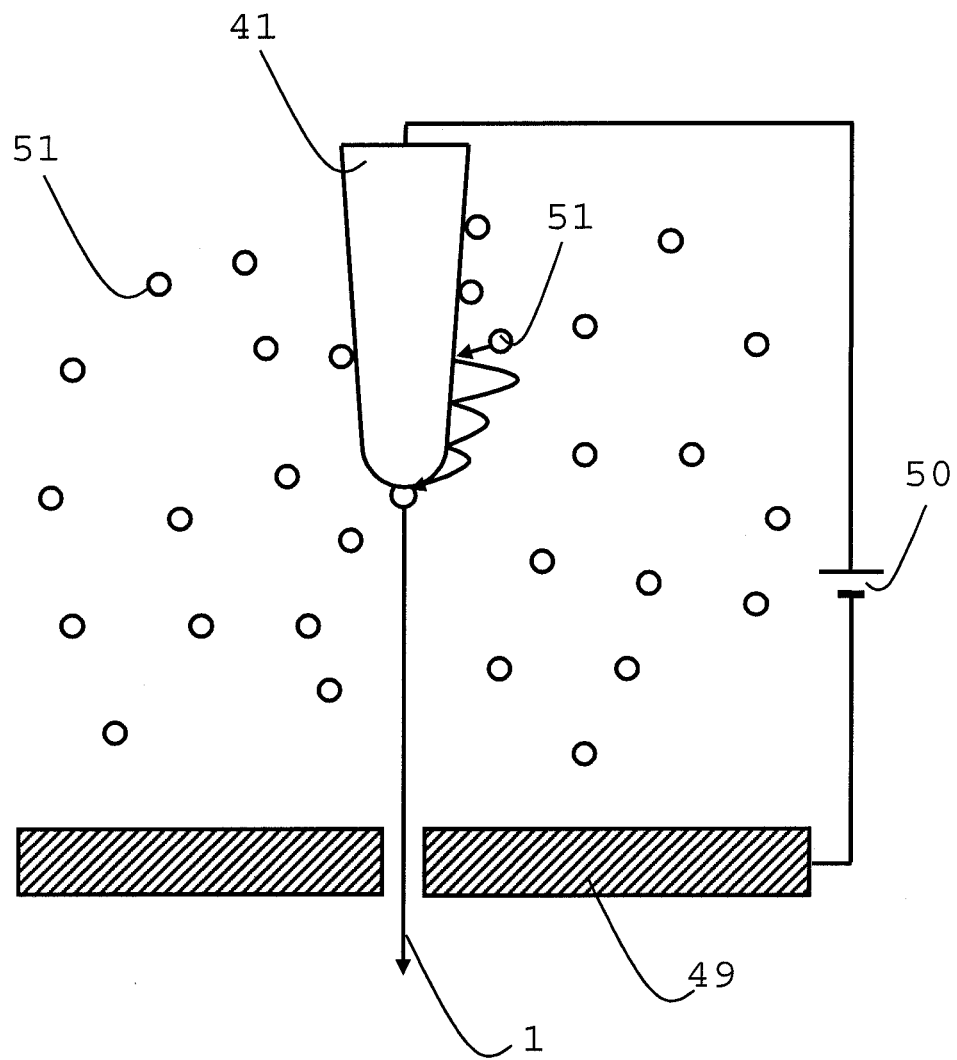
FIG. 2 is an explanatory diagram of the principle of ion beam irradiation according to the embodiment of the present invention.

Next, the principle of ion beam irradiation is described with reference to FIG. 2. Nitrogen gas is supplied into the ion source chamber 40 from the ion source gas supply unit 46, and nitrogen molecules 51 exist around the emitter 41. The emitter 41 is cooled by the cooling apparatus 42, and the nitrogen molecules 51 around the emitter 41 are adsorbed to the emitter 41. Further, a power supply 50 applies a voltage between the emitter 41 and the extracting electrode 49 according to a signal from the extracting voltage control unit 32. This generates a high electric field around the tip of the emitter 41, and the nitrogen molecules 51 adsorbed to the emitter 41 move to the tip thereof. The nitrogen molecules 51 are ionized at the tip, and the ion beam 1 is emitted by the extracting voltage.

The tip of the emitter 41 is sharpened at an atomic level, and the crystal structure thereof is formed so as to be in the shape of a pyramid. Therefore, when a voltage is applied between the emitter 41 and the extracting electrode 49, a very high electric field is formed at the tip of the pyramid, and the nitrogen molecules 51 are polarized and are attracted to the tip. The attracted nitrogen molecules 51 are ionized at a high level of the electric field. The nitrogen ions are emitted from an opening in the extracting electrode 49 toward the inside of the sample chamber 20. The size of the region to which the ion beam is emitted, that is, the size of the ion source, is extremely small, and thus, a nitrogen ion beam having a small beam diameter on the sample and high intensity may be irradiated.

The extracting voltage is now described. The electric field necessary for ionizing the ion source gas depends on gas species. When the gas is helium, the necessary electric field is $4.40 \times 10^{10}$ V/m. When the gas is nitrogen, the necessary electric field is $1.65 \times 10^{10}$ V/m, which is lower than that in the case of helium. In this way, nitrogen may be ionized by an electric field which is lower than that in the case of helium, and thus, the applied voltage may be lower than that in the case of helium. When the applied voltage is high, field evaporation of the emitter itself occurs and the emitter is worn earlier, and thus, by using nitrogen, emitter 41 may be used longer. The applied voltage which can cause the ion beam to be emitted may vary depending on the shape of the tip of the emitter 41, but, in this embodiment, the ion beam 1 may be emitted when the applied voltage is 0.5 to 20 kV.

By the way, in order to perform micromachining of the sample 2 with efficiency by using the ion beam 1, a current amount on the order of sub-picoamperes is necessary. When the nitrogen gas partial pressure in the ion source chamber 40 is $1.0 \times 10^{-6}$ Pa, ion beam current on the order of sub-picoamperes may be obtained. When the nitrogen gas partial pressure is $1.0 \times 10^{-5}$ Pa, $1.0 \times 10^{-4}$ Pa, $1.0 \times 10^{-3}$ Pa, and $1.0 \times 10^{-2}$ Pa, ion beams with current amounts of several picoamperes, tens of picoamperes, hundreds of picoamperes, and several nanoamperes, respectively, may be irradiated. This tendency comes from the fact that the density of the nitrogen molecules which are adsorbed to the emitter 41 and which contribute to the ionization becomes higher, and thus, the current amount increases accordingly. However, when the nitrogen gas partial pressure is higher than $1.0 \times 10^{-2}$ Pa, nitriding of the emitter 41 is promoted, and the emitter 41 itself is worn due to field evaporation.

Therefore, in this embodiment, the ion source gas supply unit 46 is controlled so that the nitrogen gas partial pressure in the ion source chamber 40 is $1.0 \times 10^{-6}$ Pa to $1.0 \times 10^{-2}$ Pa. Further, in order to cause the processing speed to be higher and to cause the emitter 41 to be worn less, it is more preferred to control the gas partial pressure to be $1.0 \times 10^{-5}$ Pa to $1.0 \times 10^{-3}$ Pa.

In order to control the gas partial pressure in the ion source chamber 40 to be in the above-mentioned range, in this embodiment, the intermediate chamber 13 is provided between the ion source chamber 40 and the sample chamber 20. Further, the ion source gas supply unit 46 includes a mass flow controller which is intermittently opened and closed.

The intermediate chamber 13 includes the orifice 14 between the ion source chamber 40 and the intermediate chamber 13 and includes the orifice 15 between the sample chamber 20 and the intermediate chamber 13. Further, by operating the vacuum pump 16, the intermediate chamber 13 may hold the sample chamber 20 and the ion source chamber 40 at different vacuums. The base vacuum in the sample chamber 20 is on the order of $1.0 \times 10^{-5}$ Pa. Further, when the processing is carried out while the gas is sprayed on the sample 2 by the gas supply unit 5, the vacuum in the sample chamber 20 is on the order of $1.0 \times 10^{-3}$ Pa. Specifically, in such a case, the operation is carried out under a state in which the vacuum in the ion source chamber 40 is higher than that in the sample chamber 20. Without the intermediate chamber 13, the impurity gas flows into the ion source chamber 40 from the sample chamber 20 and the impurity is adsorbed to the emitter 41, which causes the ion beam irradiation to be unstable.

Further, by including the mass flow controller which is intermittently opened and closed, a slight amount of nitrogen gas may be supplied into the ion source chamber 40, and thus, the above-mentioned gas partial pressure may be materialized.

Next, temperature control of the emitter 41 is described. When the temperature of the emitter 41 is low, the density of the adsorbed nitrogen molecules 51 becomes high. Therefore, by causing the temperature of the emitter 41 to be low, the current amount of the ion beam 1 increases. However, when the temperature of the emitter 41 is low, the nitrogen molecules 51 are adsorbed to the wall portion 44 of the ion source chamber 40 and to the connecting portion 43 between the cooling apparatus 42 and the ion source chamber 40 to be solidified. The solidified nitrogen is vaporized all at once when the temperature in the ion source chamber 40 rises, and thus, the gas partial pressure in the ion source chamber 40 becomes higher abruptly, which causes the operation of the ion source to be unstable.

Accordingly, in this embodiment, the temperature of the emitter 41 is controlled to be 40 K to 200 K by the temperature control unit 34. This enables irradiation with stability of an ion beam having an amount of current necessary for micromachining.

As described above, according to the focused ion beam apparatus of this embodiment, a nitrogen ion beam may be irradiated with stability.

Second Embodiment

An embodiment of a mask repairing apparatus including the ion beam column of the first embodiment including the gas field ion source is described.

In defect repair of a mask, there is a problem in that, when an ion beam is irradiated to repair a defect, ions are implanted into a transparent portion of the mask to lower the transmittance of the mask. The reason is that ions of a metal such as gallium absorb light for exposing the mask. If a helium ion beam is used in the gas field ion source, damage to the transparent portion may be alleviated, but, the sputtering efficiency is extremely low, and thus, there is a problem in that the processing efficiency is low. In this embodiment, by repairing a mask by using a nitrogen ion beam, processing with efficiency which does not damage a transparent portion much is materialized.

Figure 3:
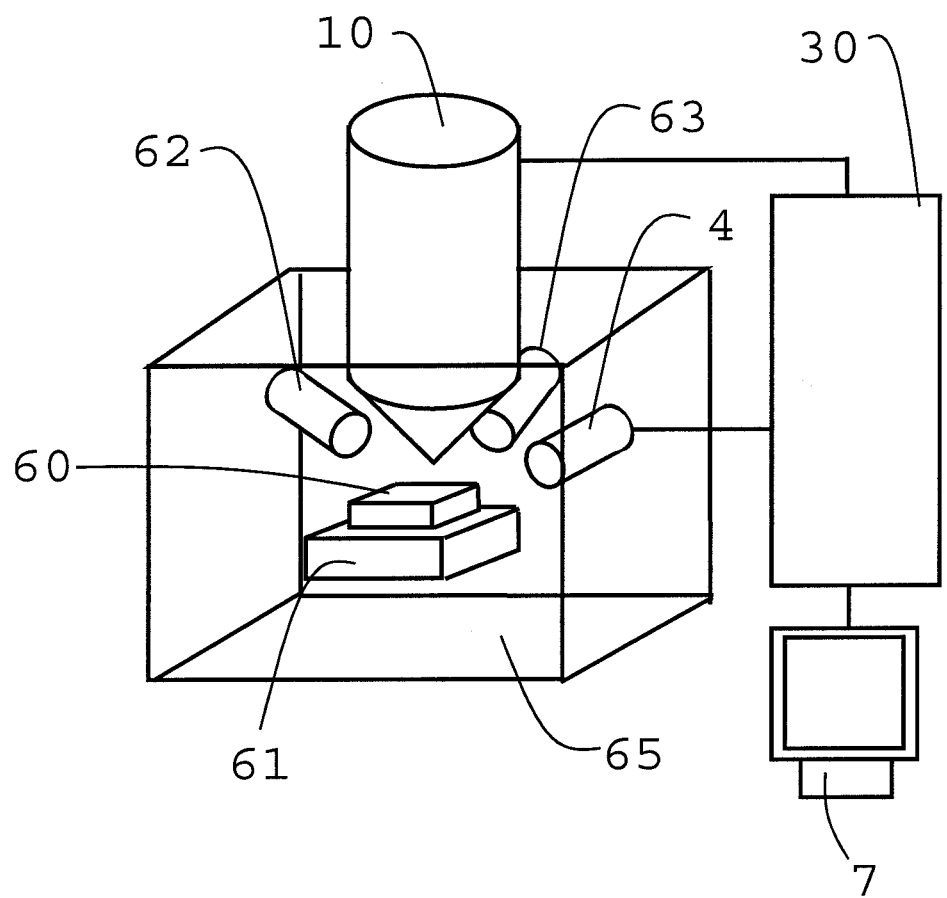
FIG. 3 is a configuration diagram of a focused ion beam apparatus which repairs a defect in a mask according to another embodiment of the present invention.

A focused ion beam apparatus for repairing a defect in a mask according to this embodiment of the present invention is mainly formed of the ion beam column 10, the control unit 30, and a sample chamber 65 as illustrated in FIG. 3.

Figure 4:
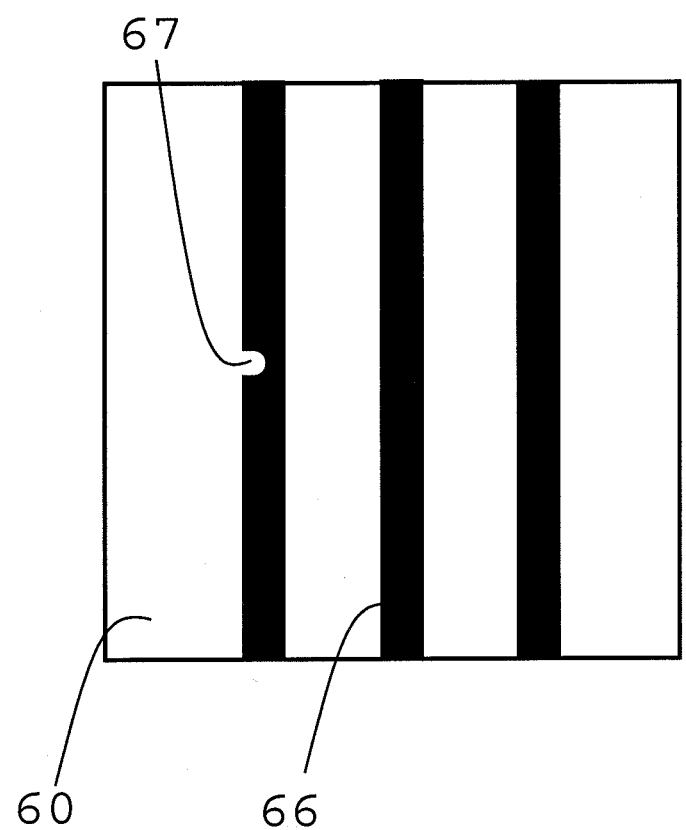
FIG. 4 is an observation image of a mask according to the another embodiment of the present invention.

Repair of a mask having a defect is now described. A nitrogen ion beam is irradiated from the ion beam column 10 onto a mask 60 which is mounted on a sample stage 61 in the sample chamber 65, and the surface of the mask is observed. FIG. 4 is an observation image of the mask 60. The mask 60 has a light shielding pattern portion 66. A defect 67 exists in a part of the light shielding pattern portion 66.

Next, the nitrogen ion beam is irradiated while a deposition gas such as a carbon-based gas or a carbon-based compound gas containing a metal such as platinum or tungsten is sprayed on the defect 67 in the mask 60 from a deposition gas supply unit 62. This causes a deposition film to be formed so as to fill the defect 67. The mask having the defect repaired in this way may transfer the pattern normally without transferring the defect when exposure to light is performed.

Further, when a defect which excessively protrudes from the light shielding pattern portion is repaired, a nitrogen ion beam is irradiated while an etching gas based on a halogen such as iodine is sprayed on the defect in the mask from an etching gas supply unit 63. This causes the protruding defect to be etched to repair the mask to be in a normal shape.

As described above, according to the focused ion beam apparatus of this embodiment, by using a nitrogen ion beam, a defect may be repaired with efficiency without implanting ions which absorb light for exposure into a transparent portion of a mask.

What is claimed is:

1. A focused ion beam apparatus comprising a gas field ion source, the gas field ion source comprising:
    an emitter for emitting an ion beam;
    an ion source chamber containing the emitter;
    a gas supply unit for supplying nitrogen to the ion source chamber so that the pressure in the ion source chamber is in the range $1.0 \times 10^{-6}$ Pa to $1.0 \times 10^{-2}$ Pa;
    an extracting electrode to which a voltage for ionizing the nitrogen and for extracting nitrogen ions is applied; and
    a temperature control unit for cooling the emitter.

2. A focused ion beam apparatus according to claim 1, wherein the gas supply unit controls supply of the nitrogen so that the pressure in the ion source chamber is in the range $1.0 \times 10^{-5}$ Pa to $1.0 \times 10^{-3}$ Pa.

3. A focused ion beam apparatus according claim 2, wherein the temperature control unit controls the temperature of the emitter to be 40 K to 200 K.

4. A focused ion beam apparatus according to claim 1, wherein the temperature control unit controls the temperature of the emitter to be 40 K to 200 K.

5. A focused ion beam apparatus according to claim 1, wherein the voltage applied to the extracting electrode is 0.5 kV to 20 kV.

6. A focused ion beam apparatus according to claim 1, further comprising a sample chamber containing a sample stage for holding a mask; and an ion beam column that includes the gas field ion source and that focuses the nitrogen ions extracted from the gas field ion source into a focused ion beam which is irradiated onto the mask to repair a defect in the mask.

7. In a focused ion beam apparatus: an ion source chamber; an emitter disposed in the ion source chamber for emitting ions; a gas supply unit that supplies nitrogen gas to the ion source chamber so that the nitrogen gas adsorbs on the surface of the emitter and that maintains the pressure in the ion source chamber in the range $1.0 \times 10^{-6}$ Pa to $1.0 \times 10^{-2}$ Pa; an extracting electrode spaced from the emitter and to which a voltage is applied to ionize the adsorbed nitrogen gas and extract nitrogen ions in the form of an ion beam; and a temperature control unit configured to control the temperature of the emitter.

8. In a focused ion beam apparatus according to claim 7; wherein the gas supply unit includes a mass flow controller that controls the amount of nitrogen gas supplied to the ion source chamber.

9. In a focused ion beam apparatus according to claim 8; wherein the gas supply unit controls supply of the nitrogen gas to maintain the pressure in the ion source chamber in the range $1.0 \times 10^{-5}$ Pa to $1.0 \times 10^{-3}$ Pa.

10. In a focused ion beam apparatus according claim 9, wherein the temperature control unit controls the temperature of the emitter to be 40 K to 200 K.

11. In a focused ion beam apparatus according to claim 10, wherein the voltage applied to the extracting electrode is 0.5 kV to 20 kV.

12. In a focused ion beam apparatus according to claim 7; wherein the gas supply unit controls supply of the nitrogen gas to maintain the pressure in the ion source chamber in the range $1.0 \times 10^{-5}$ Pa to $1.0 \times 10^{-3}$ Pa.

13. In a focused ion beam apparatus according to claim 7, wherein the temperature control unit controls the temperature of the emitter to be 40 K to 200 K.

14. In a focused ion beam apparatus according to claim 13, wherein the voltage applied to the extracting electrode is 0.5 kV to 20 kV.

15. In a focused ion beam apparatus according to claim 7, wherein the temperature control unit controls the temperature of the emitter to be 40 K to 200 K.

16. In a focused ion beam apparatus according to claim 7, wherein the voltage applied to the extracting electrode is 0.5 kV to 20 kV.

17. A focused ion beam apparatus according to claim 1, further comprising a sample chamber for containing a sample in a position to be irradiated with a beam of extracted nitrogen ions; an intermediate chamber disposed between the ion source chamber and the sample chamber and having orifices between the ion source chamber and the intermediate chamber and between the intermediate chamber and the sample chamber through which the nitrogen ion beam passes; and a vacuum pump connected to the intermediate chamber and configured to maintain the pressure in the ion source chamber in the range $1.0 \times 10^{-6}$ Pa to $1.0 \times 10^{-2}$ Pa during processing of the sample with the nitrogen ion beam.

18. In a focused ion beam apparatus according to claim 7, a sample chamber for containing a sample in a position to be irradiated with the nitrogen ion beam; an intermediate chamber disposed between the ion source chamber and the sample chamber and having orifices between the ion source chamber and the intermediate chamber and between the intermediate chamber and the sample chamber through which the nitrogen ion beam passes; and a vacuum pump connected to the intermediate chamber and configured to maintain the pressure in the ion source chamber in the range $1.0 \times 10^{-6}$ Pa to $1.0 \times 10^{-2}$ Pa during processing of the sample with the nitrogen ion beam.

* * * * *